United States Patent
Nagase et al.

(10) Patent No.: US 7,478,312 B2
(45) Date of Patent: Jan. 13, 2009

(54) METHOD AND APPARATUS FOR PERFORMING TURBO ENCODING IN A 3GPP MOBILE COMMUNICATION SYSTEM

(75) Inventors: Taku Nagase, Tokyo (JP); Masanori Sato, Tokyo (JP)

(73) Assignee: Sony Ericsson Mobile Communications Japan, Inc., Tokyo (JP)

( * ) Notice: Subject to any disclaimer, the term of this patent is extended or adjusted under 35 U.S.C. 154(b) by 434 days.

(21) Appl. No.: 10/970,873

(22) Filed: Oct. 22, 2004

(65) Prior Publication Data
US 2005/0114752 A1 May 26, 2005

(30) Foreign Application Priority Data
Oct. 23, 2003 (JP) .............................. 2003-363583

(51) Int. Cl.
H03M 13/03 (2006.01)
(52) U.S. Cl. ...................................... 714/790; 714/755
(58) Field of Classification Search ................. 714/790, 714/755
See application file for complete search history.

(56) References Cited

U.S. PATENT DOCUMENTS

| | | | |
|---|---|---|---|
| 6,744,744 B1 * | 6/2004 | Tong et al. ................... | 370/320 |
| 7,050,410 B1 * | 5/2006 | Kim et al. .................... | 370/335 |
| 2002/0176362 A1 * | 11/2002 | Yun et al. .................... | 370/236 |
| 2003/0081539 A1 * | 5/2003 | Tong et al. ................... | 370/208 |
| 2003/0131303 A1 * | 7/2003 | Kim et al. .................... | 714/755 |
| 2003/0133497 A1 * | 7/2003 | Kinjo et al. .................. | 375/152 |
| 2004/0001426 A1 * | 1/2004 | Mailaender et al. ......... | 370/203 |
| 2004/0001429 A1 * | 1/2004 | Ma et al. ..................... | 370/210 |
| 2004/0221222 A1 * | 11/2004 | Barry et al. .................. | 714/790 |
| 2005/0050427 A1 * | 3/2005 | Jeong et al. .................. | 714/755 |

FOREIGN PATENT DOCUMENTS

| | | |
|---|---|---|
| EP | 1 045 521 | 10/2000 |
| JP | 2001 57521 | 2/2001 |
| JP | 2002 164948 | 6/2002 |
| WO | WO 01 05059 | 1/2001 |

OTHER PUBLICATIONS

ETSI TS 125 212 Universal Mobile Telecommunications system (UMTS); Multiplexing and channel coding (FDD) ETSI TS 125 212 V3.1.1, Jan. 2000, XP002161524.

(Continued)

*Primary Examiner*—M. Mujtaba K Chaudry
(74) *Attorney, Agent, or Firm*—Frommer Lawrence & Haug LLP; William S. Frommer; Thomas F. Presson

(57) ABSTRACT

A communication terminal device includes: a turbo encoder that performs two systems of convolutional encoding with respect to input data and preforms turbo encoding processing with in-block interleave preformed on one of the two systems using an internal interleaver. Rate matching (puncturing) units which puncture an output of the turbo encoder based on a predetermined rate matching algorithm and interleavers, which change the output of the turbo encoder such that a puncturing cycle based on the rate matching algorithm of the rate matching units is changed. Accordingly, turbo code performance is improved.

11 Claims, 7 Drawing Sheets

OTHER PUBLICATIONS

Divsalar D et al: "On the Design of Turbo Codes" TDA Progress Report, Nov. 15, 1995, pp. 99-121, XP000900749.

Nortel Networks: "TSGR1#4(99)467: Proposal for rate matching for Turbo Codes" TSGR1#4(99)467, [Online]May 12, 1999, pp. 1-5, XP002202243 Retrieved from the Internet: URL:http://www.3gpp.org/ftp/tsg_ran/WG1_RL1/TSGR1_04/Docs/Pdfs/R1-99467.pdf> [retrieved on Sep. 12, 2006].

Omer F Acikel et al: "Punctured Turbo-Codes for BPSK/QPSK Channels" IEEE Transactions on Communications, IEEE Service Center, Piscataway, NJ, US, vol. 47, No. 9, Sep. 1999, XP011009485 ISSN: 0090-6778.

* cited by examiner

FIG. 6A
Write-In Order

| 0 | 1 | 2 | 3 | 4 | 5 | 6 |
|---|---|---|---|---|---|---|
| 7 | 8 | 9 | 10 | 11 | 12 | 13 |
| 14 | 15 | 16 | 17 | 18 | 19 | 20 |
| 21 | 22 | 23 | 24 | 25 | 26 | 27 |
| 28 | 29 | 30 | 31 | 32 | 33 | 34 |
| 35 | 36 | 37 | 38 | 39 | 40 | 41 |
| 42 | 43 | 44 | 45 | 46 | 47 | 48 |

FIG. 6B
Read-Out Order

| 0 | 7 | 14 | 21 | 28 | 35 | 42 |
|---|---|---|---|---|---|---|
| 1 | 8 | 15 | 22 | 29 | 36 | 3 |
| 2 | 9 | 16 | 23 | 30 | 37 | 44 |
| 3 | 10 | 17 | 24 | 31 | 38 | 45 |
| 4 | 11 | 18 | 25 | 32 | 39 | 46 |
| 5 | 12 | 19 | 26 | 33 | 40 | 47 |
| 6 | 13 | 20 | 27 | 34 | 41 | 48 |

FIG. 7A
Turbo Encoder Output

```
*         *         *         *         *         *         *
0000000000111111111122222222223333333333444444444455555555556666666677777··
01234567890123456789012345678901234567890123456789012345678901234567890 1234··
```

FIG. 7B
7×7 Interleaver Output

```
*******                                              *******
0012234001223400122340011233401123440122344567789556778955678··
01234567890123456789012345678901234567890123456789012345678901234 567890 1234··
```

FIG. 7C
Rate Matching Algorithm Output

```
                                                     *******
x012234x012334x112334x112334x112344x122344x567789x567789x5678··
x741852x852963x963074x074185x185296x296307x307418x630741x741852x852963x9630··
```

METHOD AND APPARATUS FOR PERFORMING TURBO ENCODING IN A 3GPP MOBILE COMMUNICATION SYSTEM

BACKGROUND OF THE INVENTION

1. Field of the Invention

The present invention relates to a communication terminal device and a communication method for performing turbo encoding processing with respect to data that should be transmitted in accordance with a 3GPP ($3^{rd}$ Generation Partnership Projects) mobile communication system as well as a transmission method of the communication terminal device, a reception method of the communication terminal device and a transmission and reception method of the communication terminal device. The present invention is applicable to error correction encoding processing which uses a turbo code of a communication processor in a portable terminal device.

2. Description of the Related Art

Hitherto, in data communication using mobile phone in the 3GPP mobile communication system, there has been employed a technology in which two systems of convolutional encoding are performed with respect to input data 11 which should be transmitted as an error correction code and turbo encoding processing is performed using a turbo encoder with in-block interleave performed on one of the two systems by an internal interleaver.

FIG. 1 is a block diagram showing an encoding circuit of a conventional method.

With respect to the input data 11 to be transmitted, a turbo encoder 10 includes: two systems of convolutional encoder, one of which has an adder 12, D flip-flops 13, 14, and 15 and an adder 16 and the other of which has an adder 20, D flip-flops 21, 22, and 23 and an adder 24; and a turbo internal interleaver 19 which performs the in-block interleave with respect to the other convolutional encoder.

In FIG. 1, in order to obtain a desired encoding rate, rate matching units 27 and 29 are used to thin out parity bits 18 and 25 which are output from the turbo encoder 10 based on a rate matching algorithm. The turbo encoder 10 converts both a system bit 17 in which the input data 11 is output without any change and the output from the rate matching units 27 and 29 from parallel data to serial data in a parallel-serial converter 30 to output an encoded output 31.

The encoding rate of the turbo code in the turbo encoder 10 can be set to various values according to various communication services. An adjustment of the encoding rate of the turbo code is performed by thinning out (puncturing) the output of the turbo encoder 10 through an application of a regulation established as the rate matching units 27 and 29, instead of changing the encoding rate thereof.

[Non-patent reference 1] (Name of Standard) 3GPP TSG-RAN Working Group 1#32, Paris, France, MAY 19-23, 2003, "R1-030421 Turbo Coder Irregularities in HSDPA.doc", (on-line) [searched on Sep. 3, 2003] Internet <URL:http://www.3gpp.orgftp://ftp.3gpp.org/specs /2003-03/>

When the turbo encoding processing is performed in the above described turbo encoder 10, there has been an inconvenience in which turbo code performance becomes deteriorated in a specific encoding rate due to a relation between a generating polynomial of the turbo code and a puncturing pattern generated by the rate matching algorithm.

The above problem occurs noticeably when a puncturing rate is high and a cycle of the puncturing pattern is 7 bits as shown in the standard of the non-patent reference 1. This is attributed to the generating polynomial of the convolutional encoder which is used for the turbo encoder. In other words, when an arbitrary one bit to be input into the convolutional encoder is considered, an output bit not affected by the input bit appears at a 7-bit cycle as the output of the convolutional encoder. Although the above problem can be avoided either by changing the generating polynomial of the convolutional encoder or by changing the rate matching algorithm, there is a disadvantage of not utilizing an existing design asset.

Accordingly, the present invention aims to provide a communication terminal device and a communication method capable of not deteriorating the turbo code performance when the communication is performed at a specific encoding rate in the mobile phone in accordance with the 3GPP mobile communication system.

SUMMARY OF THE INVENTION

In order to solve the above described problem and to achieve the aim of the present invention, a communication terminal device according to the present invention includes: an encoding means for performing two systems of convolutional encoding with respect to data which should be transmitted and for performing turbo encoding processing with in-block interleave performed on one of the two systems by an internal interleaver; a puncturing means for puncturing an output of the encoding means based on a predetermined rate matching algorithm; and a changing means for changing the output of the encoding means such that a puncturing cycle based on the rate matching algorithm of the puncturing means is changed.

Accordingly, the following operation can be obtained. Specifically, the puncturing cycle based on the rate matching algorithm of the puncturing means is changed by the changing means for changing the output of the encoding means. With this configuration, the turbo code performance can be prevented from deteriorating at a specific encoding rate since the cycle of the rate matching algorithm of the puncturing means does not become a specific bit cycle on a transmitting side.

Further, a communication method of the present invention includes the steps of: performing two systems of convolutional encoding with respect to data which should be transmitted and performing turbo encoding processing with in-block interleave performed on one of the two systems by an internal interleaver; puncturing an output of the encoding means based on a predetermined rate matching algorithm by a puncturing means; and changing the output of the encoding means by the changing means such that the puncturing cycle based on the rate matching algorithm of the puncturing means is changed.

Further, a communication terminal device of the present invention includes: an inserting means for inserting based on a predetermined rate matching algorithm a predetermined value into two systems of convolutionally encoded data which are taken out from data to be received through wireless communication; a changing means for changing an output from the inserting means; and a decoding means for performing turbo decoding processing by recursively performing decoding processing with respect to two systems of convolutionally decoded data output from the above changing means.

Further, a communication terminal device of the present invention includes: a decoding means for taking out two systems of convolutionally encoded data from the received data and for performing the turbo decoding processing by recursively performing decoding processing with respect to the two systems of convolutionally decoded data; an inserting means for inserting based on the predetermined rate matching algorithm a predetermined value into two systems of convolulutionally encoded data; and a changing means for changing an input into the decoding means such that an inserting cycle based on the rate matching algorithm of the inserting means is changed.

Further, a reception method of a communication terminal device of the present invention includes the steps of: inserting based on the predetermined rate matching algorithm a predetermined value into two systems of convolutionally encoded data taken out from data to be received through wireless communication; changing an output from the inserting means; and performing turbo decoding processing by recursively performing decoding processing with respect to two systems of convolutionally decoded data output from the changing means.

Further, a reception method of a communication terminal device of the present invention includes the steps of: taking out two systems of convolutionally encoded data from data to be received and performing turbo decoding processing by recursively performing decoding processing by decoding means with respect to the two systems of convolutionally decoded data; inserting based on a predetermined rate matching algorithm a predetermined value into the two systems of convolutionally encoded data by the inserting means; and changing an input into the decoding means by the changing means such that an inserting cycle based on the rate matching algorithm of the inserting means is changed.

Further, a communication terminal device of the present invention includes: a turbo encoder which performs two systems of convolutional encoding with respect to the data which should be transmitted through wireless communication with the in-block interleave performed on one of the two systems by the internal interleaver; a first rate matching unit which punctures the output of the turbo encoder based on a predetermined rate matching algorithm; an interleaver which is inserted between the turbo encoder and the first rate matching unit and which changes an output of the turbo encoder such that a puncturing cycle of a corresponding rate matching unit is changed; a second rate matching unit which inserts based on the predetermined rate matching algorithm a predetermined value into two systems of convolutionally encoded data taken out from the data to be received through wireless communication; a deinterleave which changes an output from the second rate matching unit; and a turbo decoder which performs turbo decoding processing by recursively performing decoding processing with respect to the two systems of convolutionally decoded data output from the deinterleave.

Furthermore, a transmission and reception method of a communication terminal device of the present invention is the method, in which two systems of convolutional encoding are performed with respect to data which should be transmitted through wireless communication, the turbo encoding processing is performed with in-block interleave performed on one of the two systems by an internal interleaver, an output of the turbo encoding processing is changed after the turbo encoding processing is performed, and the changed output of the turbo encoding processing is punctured based on a predetermined rate matching algorithm; and also, a predetermined value is inserted into two systems of convolutional encoding data taken out from data to be received through wireless communication based on a predetermined rate matching algorithm, the order of data to which the predetermined value is inserted is changed after the predetermined value is inserted, turbo decoding processing is performed by recursively performing decoding processing with respect to two systems of convolutional decoding data corresponding to the above data in which the order thereof is changed.

According to the present invention, the turbo code performance can be prevented from deteriorating at a specific encoding rate without changing a generating polynomial of the convolutional encoder for turbo encoding and the rate matching algorithm of the 3GPP method on the transmitting side, and therefore, the design asset can be utilized efficiently.

Further, according to the present invention, the turbo code performance can be prevented from deteriorating at a specific decoding rate without changing the generating polynomial of a recursive decoder for turbo decoding and the rate matching algorithm of the 3GPP method on the receiving side, and therefore, the design asset can be utilized efficiently.

BRIEF DESCRIPTION OF THE DRAWINGS

FIGS. 6A and 6B are diagrams showing an example of an interleaver, in which FIG. 6A shows the write-in order and FIG. 6B shows the read-out order; and FIGS. 7A to 7C are diagrams showing an effectiveness of an insertion of the interleaver, in which FIG. 7A shows a turbo encoder output, FIG. 7B shows a 7×7 interleaver output and FIG. 7C shows a rate matching algorithm output.

DESCRIPTION OF THE PREFERRED EMBODIMENTS

Figure 1:
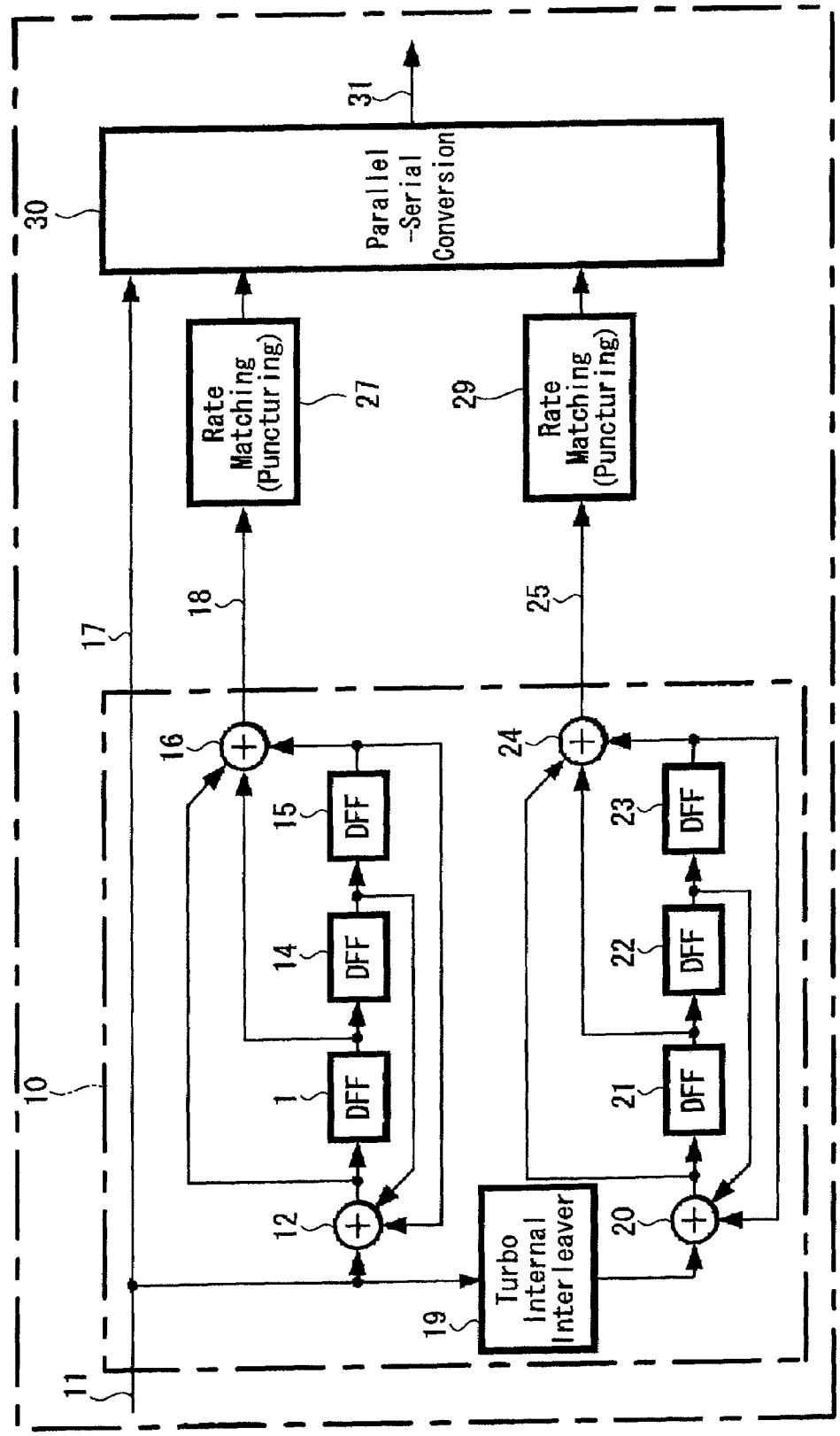
FIG. 1 is a block diagram showing an encoding circuit in a conventional method.
Figure 2:
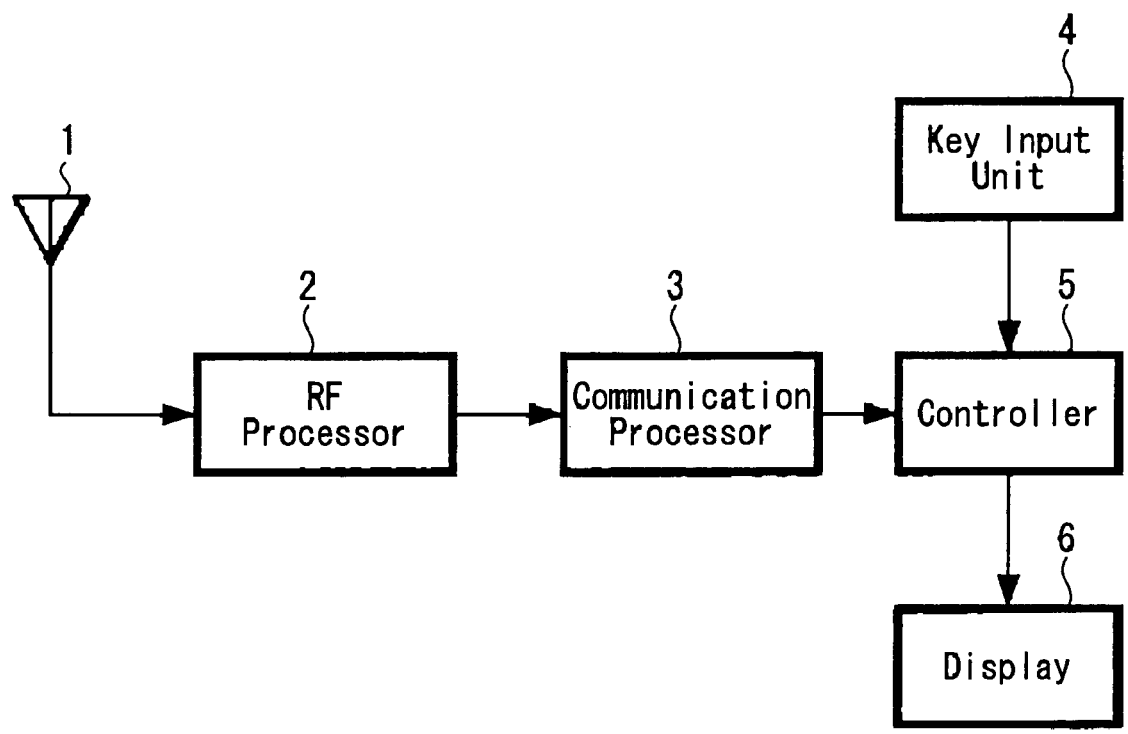
FIG. 2 is a block diagram showing a configuration of a portable terminal device to which a communication device according to an embodiment of the present invention is applied.

FIG. 2 is a block diagram showing a configuration of a portable terminal device to which a resending data composing device according to an embodiment of the present invention is applied. The portable terminal device is assumed to have a configuration applicable to a W-CDMA (Wideband-Code Division Multiple Access) method, for example.

In FIG. 2, a received signal input into the portable terminal device by the wireless communication through an antenna 1 is amplified in an RF processor 2 by a low noise amplifier and after a frequency conversion from a high frequency to an intermediate frequency is performed, a linear amplification is performed in an automatic gain control amplifier.

Further, the amplified signal is orthogonally detected in a communication processor 3 to generate an orthogonal component of the same phase. An analog signal of the orthogonal component of the same phase is converted into a digital signal in an A/D converter. Furthermore, the orthogonal component of the same phase which is converted into the digital value is inversely spread using the same spreading code as a spreading code of a spread receiving signal after band is limited by a root Nyquist filter, thereby being time separated into a plurality of multi-pass components having different propagation delay time.

Coherent RAKE composition is performed on the time separated pass, error correction decoding by deinterleave and channel decoding is performed on a data series after the RAKE composition, and thereafter, a judgment of binary data is performed and a transmission data series is reproduced. A separation from the reproduced data series into each transport channel and a detection of a block error are performed, and the reproduction data is output.

The output reproduction data is transferred to an application software processor which is a layer higher than a controller 5. The application software processor which is the higher layer of the controller 5 displays the reproduction data and a reproduction state in a display 6 with key input to a key input unit 4 which is performed by a user.

The communication device according to an embodiment of the present invention is applied to the error correction encoding processing in the above described communication processor 3 of the portable terminal device. Hereinafter, an explanation will be made with respect to the communication device.

Figure 3:
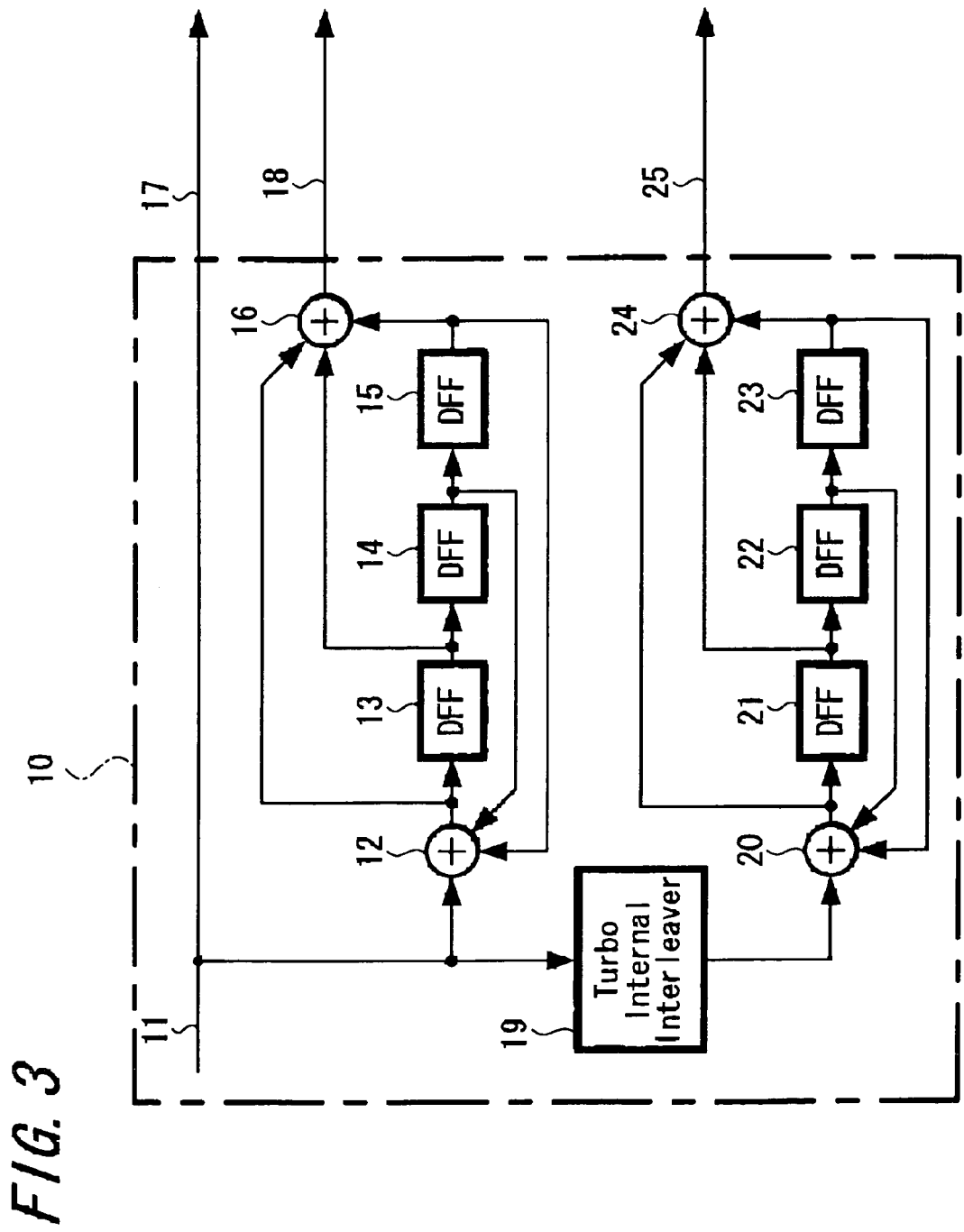
FIG. 3 is a block diagram showing a configuration of a turbo encoder used for a communication processor.

FIG. 3 is a block diagram showing a configuration of a turbo encoder used for a communication processor of a communication device. The turbo encoder 10 includes: with respect to input data to be transmitted 11 two systems of convolutional encoder, one of which has an adder 12, D flip-flops 13, 14, and 15 and an adder 16, and the other of which has an adder 20, D flip-flops 21, 22, and 23 and an adder 24; and a turbo internal interleaver 19 which performs the in-block interleave with respect to the other convolutional encoder.

In FIG. 3, in case of the 3GPP, two systems of convolutional encoder in the turbo encoder 10 output two kinds of parity bit 18 and 25 in which the number of bits in trebled quantity is convolutionally encoded through three stages of D flip-flops having a return respectively. Further, the turbo encoder 10 outputs the input data 11 as a system bit 17 without any change.

Figure 4:
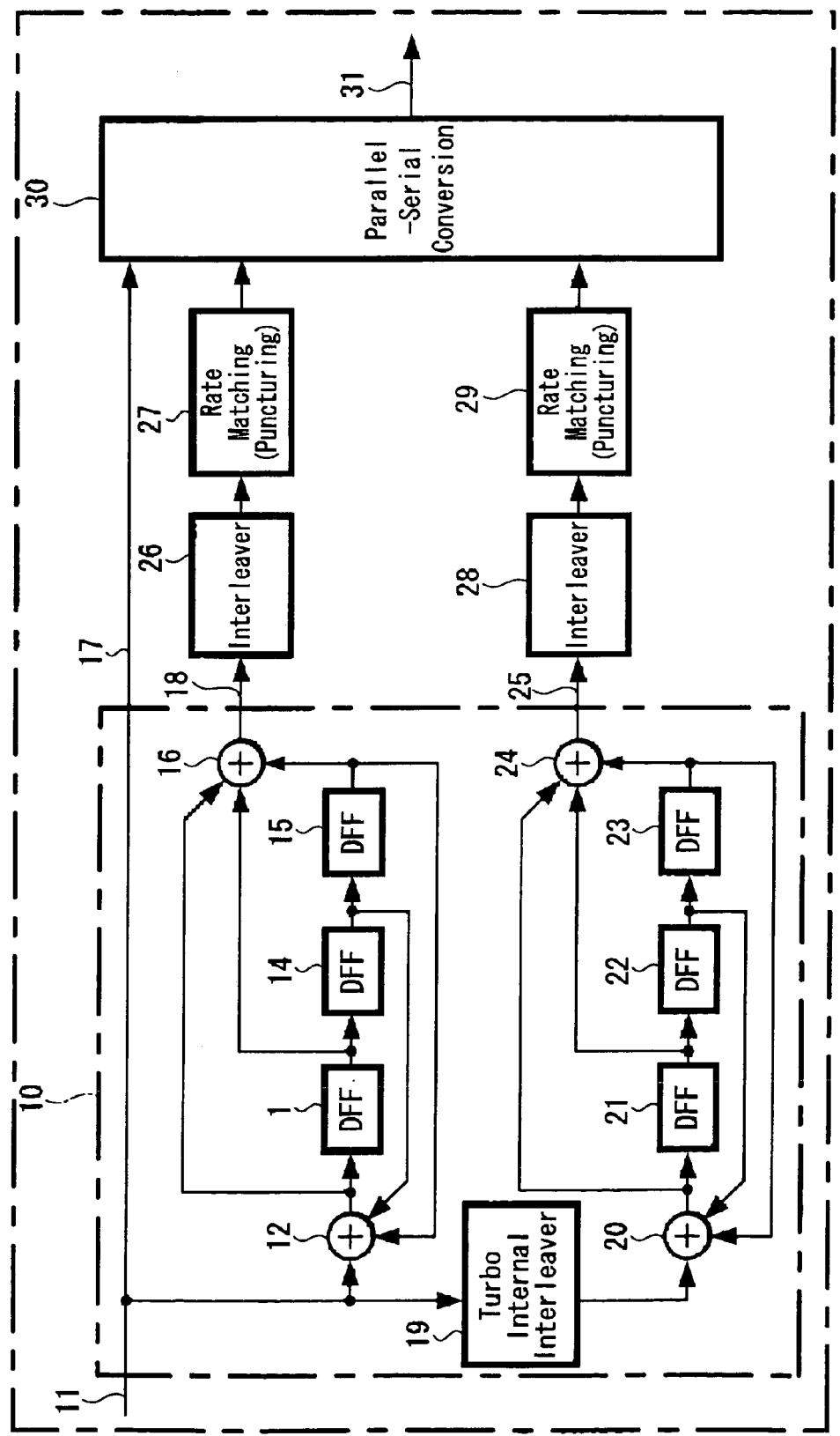
FIG. 4 is a block diagram showing an encoding circuit of the present invention.

FIG. 4 is a block diagram of an encoding circuit of the present invention.

In FIG. 4, the turbo encoder 10 includes: two systems of convolutional encoder with respect to input data to be transmitted 11, one of which has an adder 12, D flip-flops 13, 14, and 15 and an adder 16, and the other of which has an adder 20, D flip-flops 21, 22, and 23 and an adder 24; and a turbo internal interleaver 19 which performs the in-block interleave with respect to the other convolutional encoder.

In FIG. 4, in order to obtain a desired encoding rate, rate matching units 27 and 29 are used to puncture based on a rate matching algorithm the parity bits 18 and 25 which are the output of the turbo encoder 10.

Hereupon, interleavers 26 and 28 are inserted between the turbo encoder 10 and each of the rate matching units 27 and 29, respectively. A puncturing cycle of the rate matching units 27 and 29 is made to be random by providing those interleavers 26 and 28. With respect to the amount of interleave processing of the interleavers 26 and 28 inserted between the turbo encoder 10 and the rate matching units 27 and 29, it is sufficient if the cycle of 7 bits can be made to random, so that only 8 bits or so are required, for example. As a method of the interleavers 26 and 28, a simple block interleaver, for example, can be applied.

The turbo encoder 10 converts the system bit 17, in which the input data 11 is output without any change, and the output of the rate matching units 27 and 29 from parallel data to serial data in a parallel-serial converter 30 to output encoded output 31.

Figure 5:
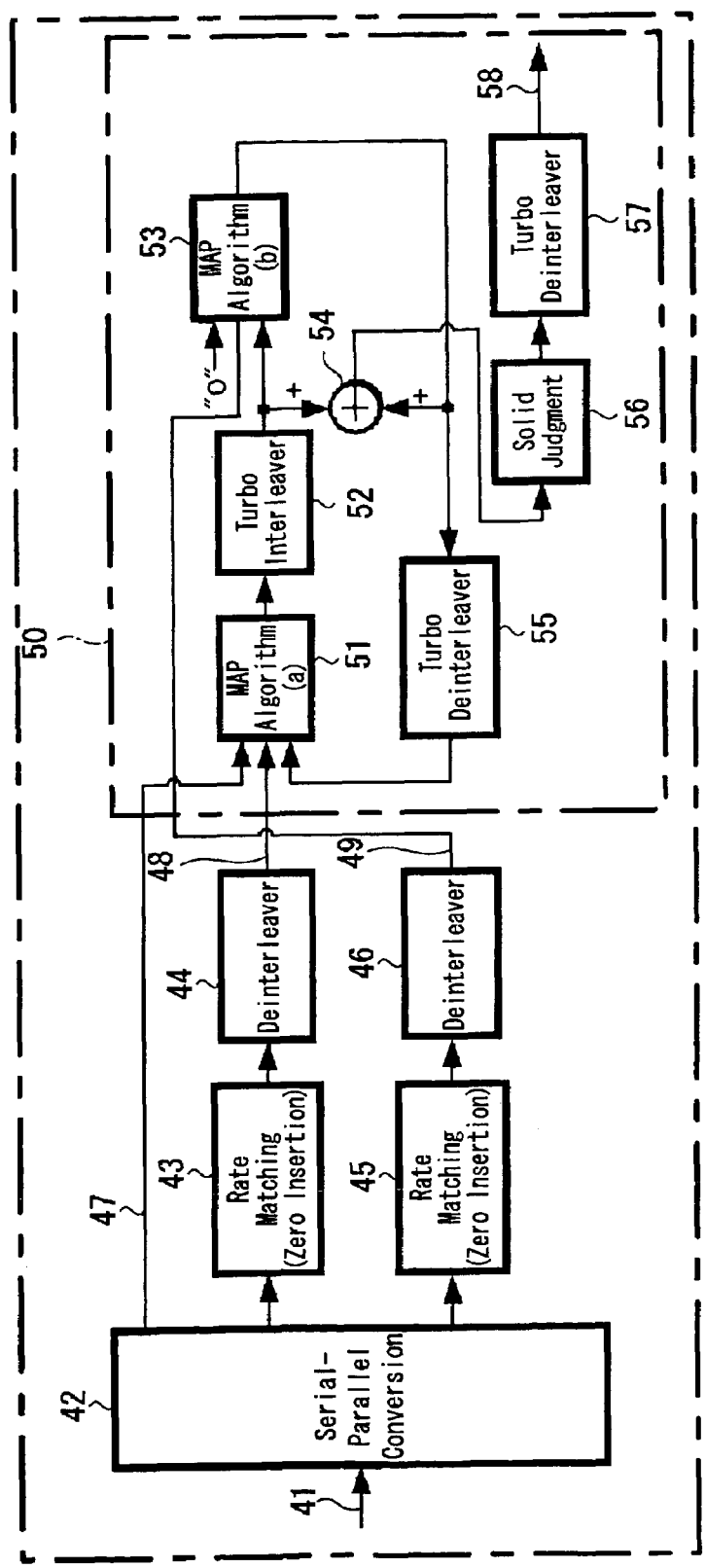
FIG. 5 is a block diagram showing a decoding circuit of the present invention.

FIG. 5 is a block diagram of a decoding circuit of the present invention.

In FIG. 5, a received signal 41 is converted in a parallel-serial converter 42 from serial data to parallel data of an system bit 47 corresponding to the system bit 17 on the side of the above described turbo encoder 10 and two outputs corresponding to the outputs of the rate matching units 27 and 29.

With respect to the two outputs corresponding to the outputs of the rate matching units 27 and 29, zero data is inserted in data positions corresponding to punctured data positions in the rate matching units 27 and 29 respectively in the rate matching units 43 and 45 based on the rate matching algorithm. Accordingly, the number of bits input into a turbo decoder 50 is made to be equal to the number of bits output from the turbo decoder 50.

Hereupon, deinterleavers 44 and 46 are inserted between the turbo decoder 50 and the rate matching units 43 and 45 respectively to return the interleave processing of the interleavers 26 and 28 back to the original state.

The sequence of bits in two parity bits 48 and 49 which are input into the turbo decoder 50 is made to be the same order of the output from the turbo encoder 10 in those deinterleavers 44 and 46.

The turbo decoder 50 performs decoding processing for returning the encoded data to the original data which was encoded by the turbo encoder 10.

The system bit 47 and parity bit 48 of one side are input into a MAP algorithm unit 51 of the turbo decoder 50. The first MAP (Mobile Application Part) algorithm unit 51 which performs recursive decoding computes external data using the system bit 47 and the parity bit 48. An output of the MAP algorithm unit 51 is input into a turbo interleaver 52. The turbo interleaver 52 performs interleave for turbo decoding with respect to the output of the MAP algorithm unit 51.

Moreover, zero data, the parity bit 49 of the other side and an output of the turbo interleaver 52 are input into a MAP algorithm unit 53 of the turbo decoder 50. The second MAP algorithm unit 53 which performs the recursive decoding renews the external data which is the output of the turbo interleaver 52 using the zero data and the parity bit 49 of the other side. Hereupon, the zero data is input into the MAP algorithm unit 53 due to a reason that there is no data corresponding to the system bit 47.

An output of the MAP algorithm unit 53 is input into a turbo deinterleaver 55. The turbo deinterleaver 55 makes the order of the output from the MAP algorithm unit 53 become the same order as the output of the turbo interleaver 52. An output from the turbo deinterleaver 55 is returned to the turbo deinterleaver 55. Accordingly, the renewed external data is fed back to the second MAP algorithm unit 53, so that the above described processing can be performed repeatedly.

After repeating processing the predetermined number of times, the output of the turbo interleaver 52 and the output of the MAP algorithm unit 53 are added in an adder 54, the added output is input into a solid judgment unit 56 to make a solid judgment of a logarithmic likelihood ratio of the data, so that a transmitting data series is reproduced.

A judgment output of the solid judgment unit 56 is input into a turbo deinterleaver 57. The turbo deinterleaver 57 makes the order of the judgment output become the same order as the output from the turbo interleaver 52 to output a decoded result 58.

FIGS. 6A and 6B are diagrams showing an example of an interleaver, in which FIG. 6A shows the write-in order and FIG. 6B shows the read-out order.

The followings are required for the interleavers 26 and 28 which are inserted between the above described turbo encoder 10 and each of the rate matching units 27 and 29. First, the position of the actually punctured bit output from the turbo encoder 10 can be randomized when the rate matching units 27 and 29 perform the puncturing of the 7-bit cycle.

Secondly, an occasion in which the actually punctured bit output from the turbo encoder 10 becomes a 7-bit interval becomes less frequent when the rate matching units 27 and 29 perform the puncturing in a cycle other than 7-bit cycle.

As an example, an explanation is made to an operation of a case in which a block interleaver of 7×7 as shown in FIGS. 6A and 6B is used. When the write-in order shown in FIG. 6A has a data arrangement in ascending order in the horizontal direction, a rearrangement of the data is performed by the interleaver so that the read-out order shown in FIG. 6B becomes the data arrangement in ascending order in the vertical direction.

FIG. 7 is a diagram showing an effectiveness of an interleaver insertion, in which FIG. 7A shows a turbo encoder output, FIG. 7B shows a 7×7 interleaver output and FIG. 7C shows a rate matching algorithm output.

FIG. 7A shows the bit sequence output from the turbo encoder 10. In order to make the explanation simple, an asterisk (*) mark is put on the bit of every 7 bits to which an attention is paid. If the data of FIG. 7A is input directly into the rate matching units 27 and 29, there may be the case in which the bits having the asterisk (*) mark are collectively punctured when the rate matching units 27 and 29 perform the puncturing of the 7-bit cycle, and therefore, the turbo code performance becomes deteriorated.

Then, the output of the turbo encoder 10 is input into the 7×7 interleaver as shown in FIG. 7B to obtain the output thereof. The output of the 7×7 interleaver has such bit sequence that 7 bits to which the asterisk (*) mark is given continue at an interval of every 42 bits.

Accordingly, as shown in FIG. 7C, there is no such case that the bits to which the asterisk (*) mark is given are collectively punctured even if the rate matching units 27 and 29 perform the puncturing of the 7-bit cycle. Hereupon, a bit shown with x mark is the actually punctured bit.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A communication terminal device which performs processing with respect to data to be transmitted through wireless communication and performs transmission, comprising:
   encoding means for performing two systems of convolutional encoding with respect to said data to be transmitted and for performing turbo encoding processing with in-block interleave performed on one of the two systems using an internal interleaver;
   puncturing means for puncturing an output from said encoding means based on a predetermined rate matching algorithm; and
   changing means for changing an output from said encoding means,
   wherein a changing cycle of the changing means matches a puncturing cycle of the puncturing means.

2. The communication terminal device according to claim 1, wherein said changing means changes the output by a predetermined unit such that the output of said encoding means becomes random.

3. The communication terminal device according to claim 1, wherein said changing means changes the output by a predetermined unit such that the output of said encoding means has no specific bit cycle when said rate matching algorithm is of puncturing in cycles other than the specific bit cycle.

4. A communication method of performing transmission from a communication terminal device after performing communication processing with respect to data to be transmitted through wireless communication, comprising the steps of:
   performing two systems of convolutional encoding to said data to be transmitted and performing turbo encoding processing with in-block interleave performed on one of the two systems using an internal interleaver;
   puncturing an output of said encoding based on a predetermined rate matching algorithm; and
   changing an output of said encoding,
   wherein a changing cycle of the changing step matches a puncturing cycle of the puncturing step.

5. The communication method according to claim 4, further comprising changing the output by a predetermined unit such that the output becomes random.

6. The communication method according to claim 4, wherein said changing step changes the output by the predetermined unit such that the output of said encoding has no specific bit cycle when said rate matching algorithm is of puncturing in cycles other than the specific bit cycle.

7. A communication terminal device, comprising:
   a turbo encoder which performs two systems of convolutional encoding with respect to data to be transmitted through wireless communication and performs in-block interleave on one of the two systems using an internal interleaver;
   a rate matching unit which punctures an output of said turbo encoder based on a predetermined rate matching algorithm; and
   an interleaver that is inserted between said turbo encoder and said rate matching unit and that changes the output of said turbo encoder,
   wherein a changing cycle of the interleaver matches a puncturing cycle of the rate matching unit.

8. A communication method of a communication terminal device, wherein:
   two systems of convolutional encoding are performed with respect to data to be transmitted through wireless communication and turbo coding processing is performed with the in-block interleave performed on one of the two systems using an internal interleaver;
   an output of said turbo encoding processing is changed after the turbo encoding processing is performed; and
   the changed output of said turbo encoding processing is punctured based on a predetermined rate matching algorithm,
   wherein a changing cycle for changing the output of the turbo encoding processing matches a puncturing cycle for puncturing the changed output of the turbo encoding processing.

9. A communication terminal device, comprising:
   encoding means for performing two systems of convolutional encoding with respect to data to be transmitted through wireless communication and for performing turbo encoding processing with in-block interleave performed on one of the two systems using an internal interleaver;
   puncturing means for puncturing an output of said encoding means based on a predetermined rate matching algorithm;
   wherein a changing cycle of the first changing means matches a puncturing cycle of the puncturing means;
   inserting means for inserting a predetermined value into two systems of convolutionally encoded data taken out based on the predetermined rate matching algorithm from data to be received through wireless communication;

second changing means for changing an output from said inserting means; and decoding means for performing turbo decoding processing with recursive decoding processing performed with respect to two systems of convolutionally decoded data output from said second changing means.

10. A communication terminal device comprising:

a turbo encoder which performs two systems of convolutional encoding with respect to data to be transmitted through wireless communication with in-block interleave performed on one of the two systems using an internal interleaver;

a first rate matching unit which punctures an output of said turbo encoder based on a predetermined rate matching algorithm;

an interleaver that is inserted between said turbo encoder and said first rate matching unit and that changes the output of said turbo encoder, wherein a changing cycle of the interleaver matches a puncturing cycle of the first rate matching unit;

a second rate matching unit which inserts based on the predetermined rate matching algorithm a predetermined value into two systems of convolutionally encoded data taken out from data to be received through wireless communication;

a deinterleave which changes an output from said second rate matching unit; and a turbo decoder which performs turbo decoding processing by means of recursive decoding processing with respect to two systems of convolutionally decoded data output from said deinterleave.

11. A transmission and reception method of a communication terminal device, wherein:

with respect to data to be transmitted through wireless communication, two systems of convolutional encoding are performed and turbo encoding processing is performed with in-block interleave performed on one of the two systems using an internal interleaver, an output of the turbo encoding processing is changed, after said turbo encoding processing is performed, and the changed output of said turbo encoding processing is punctured based on a predetermined rate matching algorithm, wherein a changing cycle for changing the output of the turbo encoding processing matches a puncturing cycle for puncturing the changed output of the turbo encoding processing; and with respect to data taken out based on the predetermined rate matching algorithm from data to be received through wireless communication, a predetermined value is inserted into two systems of convolutionally encoded data, the order of data to which said predetermined value is inserted is changed after the predetermined value is inserted, turbo decoding processing is performed by means of recursive decoding processing with respect to two systems of convolutionally decoded data corresponding to said data in which the order thereof is changed.

* * * * *